(12) United States Patent
Kawaguchi et al.

(10) Patent No.: US 6,794,888 B2
(45) Date of Patent: Sep. 21, 2004

(54) PROBE DEVICE (75) Inventors: Koji Kawaguchi, Nirasaki (JP); Masashi Shimizu, Nirasaki (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 10/473,250

(22) PCT Filed: Dec. 9, 2002

(86) PCT No.: PCT/JP02/12866
§ 371 (c)(1),
(2), (4) Date: Sep. 29, 2003

(87) PCT Pub. No.: WO03/050866
PCT Pub. Date: Jun. 19, 2003

(65) Prior Publication Data
US 2004/0113643 A1 Jun. 17, 2004

(30) Foreign Application Priority Data
Dec. 13, 2001 (JP) ........................ 2001-379376

(51) Int. Cl.[7] ........................ G01R 31/02; G01R 31/26; G01R 1/04
(52) U.S. Cl. .................. 324/754; 324/765; 324/158.1
(58) Field of Search ................ 324/158.1, 72.5, 324/73.1, 754–755, 757–758, 760, 765; 439/482; 414/222.01, 225.05

(56) References Cited

U.S. PATENT DOCUMENTS

| | | | |
|---|---|---|---|
| 4,966,520 A | * 10/1990 | Yokota et al. | 414/816 |
| 5,399,983 A | * 3/1995 | Nagasawa | 324/758 |
| 5,461,327 A | * 10/1995 | Shibata et al. | 324/158.1 |
| 5,489,853 A | 2/1996 | Nakajima | |
| 5,594,357 A | 1/1997 | Nakajima | |
| 5,644,245 A | * 7/1997 | Saitoh et al. | 324/754 |
| 5,703,494 A | * 12/1997 | Sano | 324/754 |
| 5,777,485 A | * 7/1998 | Tanaka et al. | 324/757 |
| 5,828,225 A | * 10/1998 | Obikane et al. | 324/758 |
| 6,075,373 A | * 6/2000 | Iino | 324/754 |
| 2003/0112002 A1 | * 6/2003 | Kawaguchi et al. | 324/158.1 |

FOREIGN PATENT DOCUMENTS

| | | | | |
|---|---|---|---|---|
| JP | 62169341 A | * | 7/1987 | ........ H01L/21/66 |
| JP | 62263647 A | * | 11/1987 | ........ G01R/31/26 |
| JP | 63-301537 | | 12/1988 | |
| JP | 02001141 A | * | 1/1990 | ........ G01R/31/26 |
| JP | 5-175290 | | 7/1993 | |
| JP | 07-035777 | | 2/1995 | |
| JP | 10-031035 | | 2/1998 | |
| JP | 11-111791 | | 4/1999 | |

OTHER PUBLICATIONS

Copy of U.S. patent application Ser. No. 09/073,989 which is the corresponding application of JP 10–31035 (JP 10–31035 was previously filed with Second IDS on Mar. 8, 2004).

* cited by examiner

Primary Examiner—David A. Zarneke
Assistant Examiner—Jermele Hollington
(74) Attorney, Agent, or Firm—Smith, Gambrell & Russell, LLP (57) ABSTRACT In the bottom face of a head plate (14), a recessed portion (14A) open to the front of a prober chamber (11) is formed. In the recessed portion (14A), a card exchange mechanism (20) for exchanging a probe card (13) is arranged. The exchange mechanism (20) includes a card supporting member (21) for supporting thereon the probe card (13), retractable mechanisms (22), air cylinders (24) and cam mechanisms (35). The retractable mechanisms (22) are designed to move the supporting member (21) in substantially horizontal directions between a connecting position of the probe card (13) corresponding to a pogo ring (16), and a region near a side opening of a case (10C). The air cylinders (24) and the cam mechanisms (35) are designed to move the supporting member (21) in vertical directions with respect to the head plate (14) so as to connect/disconnect the probe card (13) to/from a test head (15) via the pogo ring (16).

6 Claims, 7 Drawing Sheets

PROBE DEVICE

TECHNICAL FIELD

The present invention relates generally to a probe system for testing a semiconductor wafer or the like by using a probe card, particularly relates to an improvement thereof in connection with an exchange of the probe card.

BACKGROUND ART

Figure 6A:
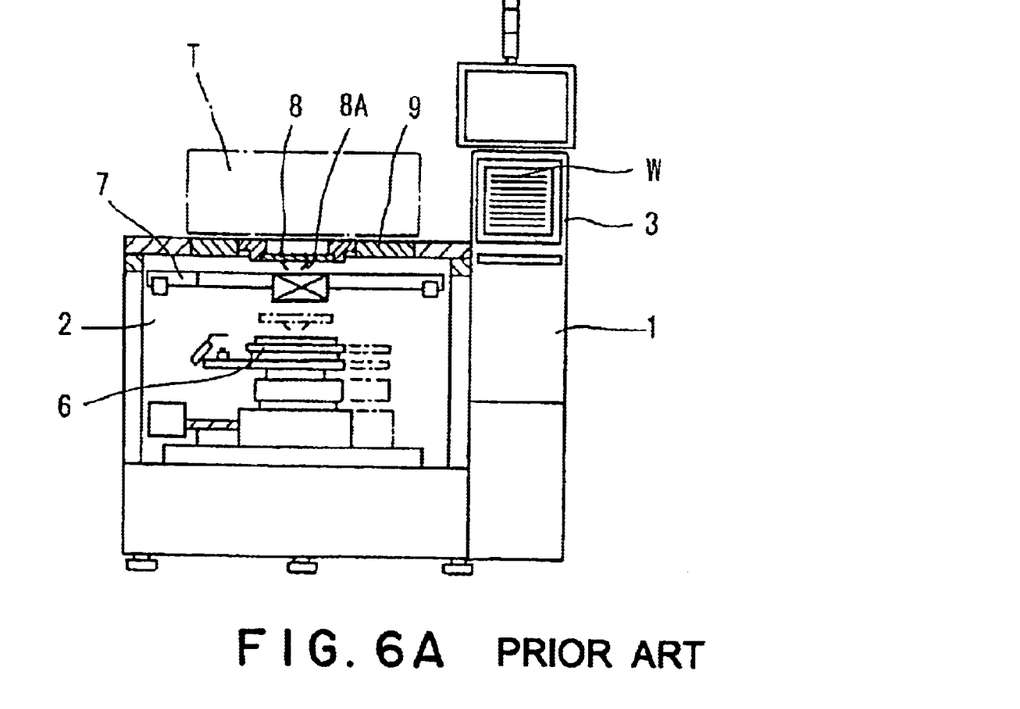
FIG. 6A is a front view of a conventional probe system, a part of which is shown as a sectional view.
Figure 6B:
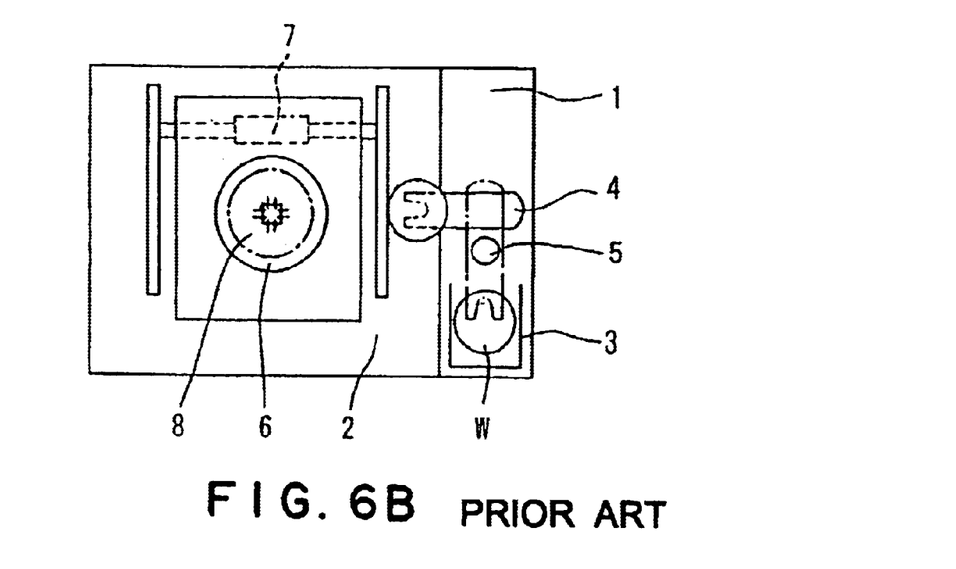
FIG. 6B is a horizontally sectional view of the probe system of FIG. 6A.

A conventional probe system 2 shown in FIGS. 6A and 6B is integrated with a loader system 1 which transfers a semiconductor wafer W, and is designed to test electric characteristics of the wafer W delivered from the loader system 1. In the loader system 1, a cassette housing section 3, a wafer transfer mechanism 4 and a sub-chuck 5 are provided. The sub-chuck 5 is designed to pre-align the wafer W on the basis of an orientation flat or notch of the wafer W when the wafer W is transferred by the wafer transfer mechanism 4.

In the probe system 2, a supporting table (main chuck) 6, an alignment mechanism 7 and a probe card 8 are provided for the test. The main chuck 6 can support thereon the wafer W delivered from the transfer mechanism 4 of the loader system 1, and is movable in horizontal and vertical directions and rotatable about a vertical axis. The alignment mechanism 7 is designed to precisely align the wafer W on the main chuck 6. The probe card 8 has probe needles 8A for testing the aligned wafer W by electrically contacting electrode pads of the wafer W. The probe card 8 is fixed to a head plate 9, which forms a ceiling surface of the probe system 2, by means of a card clamp mechanism (not shown)

On the head plate 9 of the probe system 2, a test head T is provided. The test head T is electrically and detachably connected to the probe card 8 via a pogo ring (not shown). Signals from a tester (not shown) are transmitted to the electrode pads on the wafer W to test electric characteristics of a plurality of semiconductor elements (chips) formed on the wafer W.

By the way, when such a test is carried out, it is required to exchange the probe card 8 in accordance with the kind of the wafer W. When a new probe card 8 is mounted, a manually-operatable card exchanging system (not shown) is introduced from the outside of the probe system 2, and a probe card 8 with a card holder is mounted on the main chuck 6 by means of the card exchanging system. Then, the main chuck 6 is horizontally moved to the central portion in the probe system 2 and lifted to the card clamp mechanism (not shown). Then, the card clamp mechanism operates to clamp the card holder of the probe card 8, so that the probe card 8 is fixed to the head plate 9. Then, the card exchanging system is returned to the original position outside of the probe system 2.

Thus, in the conventional probe system, the probe card 8 is transferred to the main chuck 6 by means of the card exchanging system, and is upwardly moved to the card claim mechanism by means of the main chuck 6 to be mounted. Therefore, the card claim mechanism must be provided in the probe system 2 in addition to the card exchanging system. If the main chuck 6 can not be precisely aligned with the clamp mechanism when the probe card 8 is exchanged, there are some cases where the probe card 8 can not be properly delivered between the main chuck 6 and the clamp mechanism. If the probe card 8 can not be properly delivered, there are same cases where the main chuck 6 may be damaged.

DISCLOSURE OF THE INVENTION

It is therefore an object of the present invention to provide a probe system capable of shortening the time required to exchange a probe card without the need of an independent card clamp mechanism, and capable of preventing a supporting table from being damaged.

In order to accomplish this object, the present invention provides a probe system comprising: a case defining a prober chamber for receiving an object to be tested, the case having an opening capable of being open and closed on one side thereof; a head plate forming a ceiling portion of the case; a test head provided on the head plate; a probe card detachably connected to the test head; a card supporting member supporting the probe card; a vertically moving mechanism for moving the card supporting member in vertical directions with respect to the head plate such that the probe card is connected/disconnected to/from the test head; and a horizontally moving mechanism for moving the card supporting member in substantially horizontal directions between a connecting position at which the probe card is connected and a region near the opening of the case.

This probe system preferably further comprises: a positioning mechanism for positioning the card supporting member in horizontal directions with respect to the head plate; and a backlash preventing mechanism for preventing backlash of the card supporting member positioned by the positioning mechanism with respect to the head plate.

In this probe system, the horizontally moving mechanism may comprise: a pair of first retractable mechanisms retractable while supporting the card supporting member from both sides; a pair of second retractable mechanisms retractable while supporting the first retractable mechanisms with respect to the head plate, respectively; and a pair of driving mechanisms for driving the second retractable mechanisms to extend and retract the second retractable mechanisms.

In that case, the probe system preferably further comprises a stopper mechanism for restricting extension and retraction of the first retractable mechanisms.

In this probe system, the vertically moving mechanism preferably comprises: a main lift mechanism for downwardly moving the card supporting member with respect to the head plate so as to remove the probe card from the test head, and for upwardly moving the card supporting member with respect to the head plate so as to temporarily connect the probe cared to the test head; and an auxiliary lift mechanism for further upwardly moving the card supporting member with respect to the head plate so as to completely connect the temporarily connected probe card to the test head.

In that case, the auxiliary lift mechanism may be a cam mechanism.

BEST MODE FOR CARRYING OUT THE INVENTION

Referring to FIGS. 1 through 5, an embodiment of the present invention will be described below.

Figure 1:
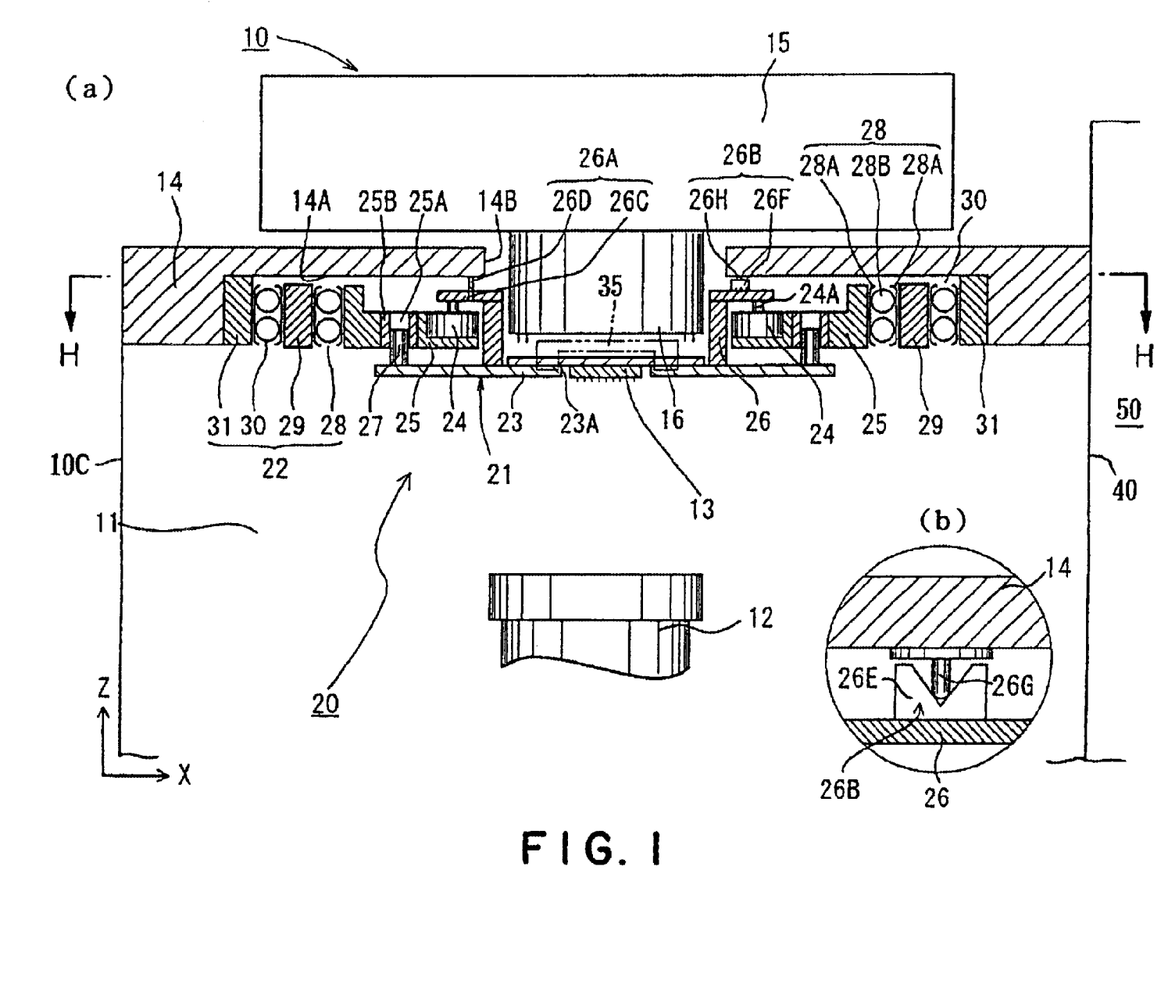
FIG. 1 is a view showing a main part of an embodiment of a probe system according to the present invention, wherein (a) is a longitudinally sectional view of the probe system, and (b) is an enlarged sectional view of a backlash preventing system.
Figure 2:
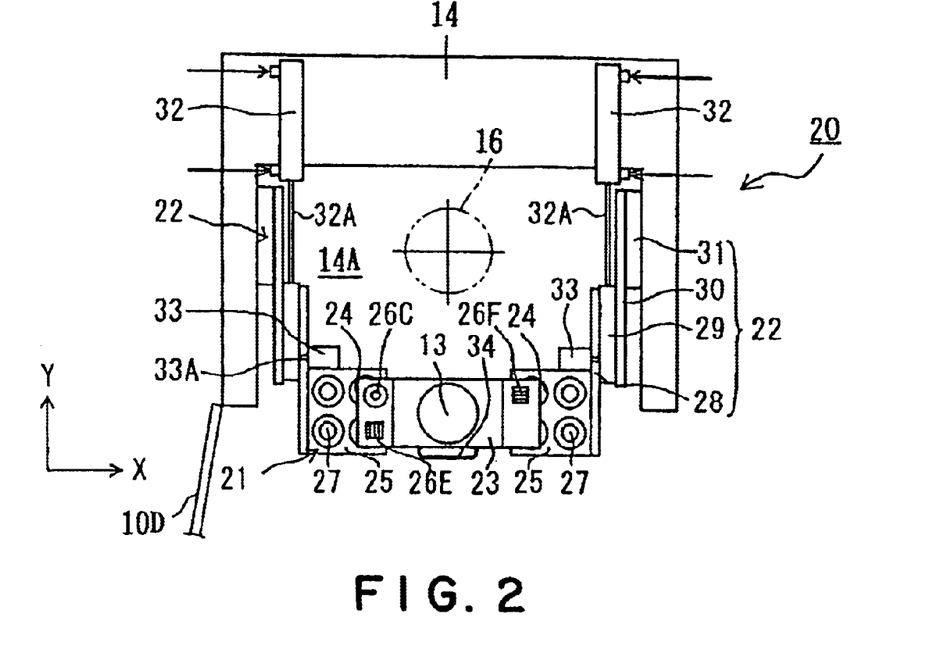
FIG. 2 is a view showing a state that a card supporting member is extended, on a cross section taken along line H—H of FIG. 1.
Figure 3:
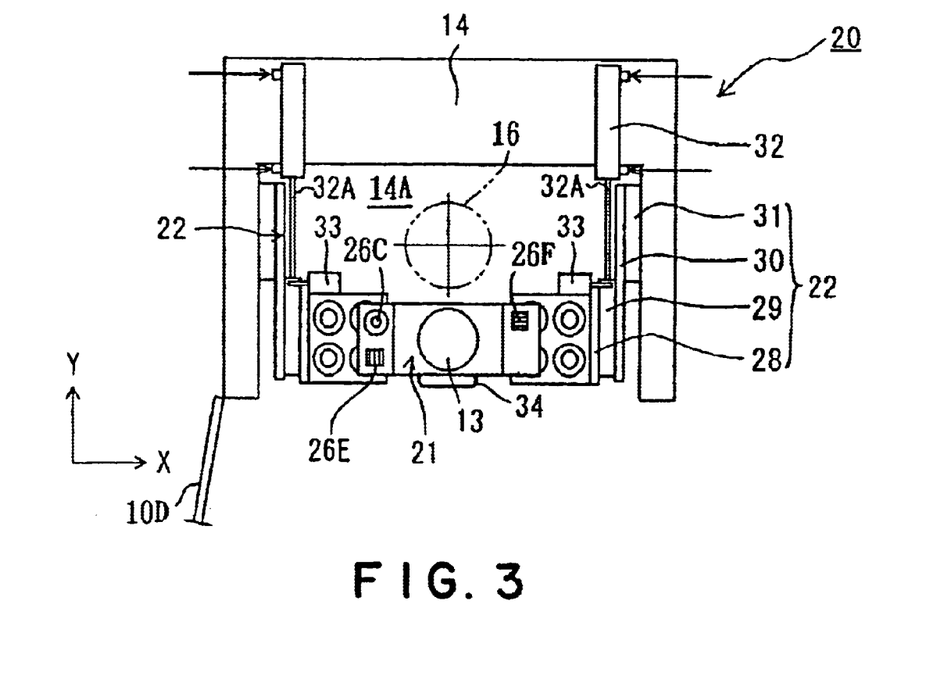
FIG. 3 is a view showing a state that a card supporting member is manually pushed into a prober chamber, on a cross section taken along line H—H of FIG. 1.
Figure 4:
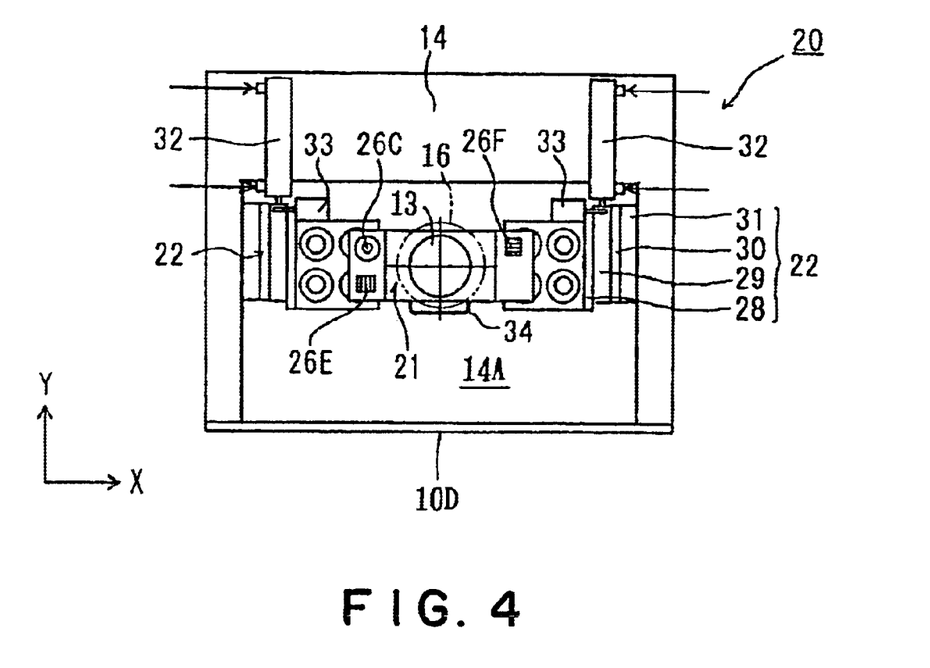
FIG. 4 is a view showing a state that a pogo ring is pushed just below a card supporting member, on a cross section taken along line H—H of FIG. 1.

As shown in FIG. 1, a probe system 10 in this embodiment is adjacent to a loader system 50, which is provided for transferring a semiconductor wafer W, via a partition wall 40. The probe system 10 has a case 10C (a part of which forms the partition wall 40) which defines a prober chamber 11 for receiving the semiconductor wafer W serving as an object to be tested. On the front side of the case C, an opening capable of being open and closed by a door 10D is provided (FIGS. 2 through 4).

In the prober chamber 11, a main chuck 12 serving as a supporting table for supporting thereon the received wafer W is provided. The main chuck 12 is designed to move in horizontal directions (X and Y directions in FIG. 2) and vertical directions (Z direction) and to rotate about a vertical axis Z. The wafer W on the main chuck 12 is tested by electrically contacting a probe card 13.

On a head plate 14 forming a ceiling of the case 10C, a test head 15 is arranged. The probe card 13 is electrically and detachably connected to the test head 15 via a pogo ring 16. As shown in FIGS. 1 through 4, a rectangular recessed portion 14A open to the front side (the side of the door 10D) of the prober chamber 11 is formed in the bottom of the head plate 14. In the recessed portion 14A of the head plate 14, a card exchanging mechanism 20 for exchanging the probe card 13 is arranged. In a substantially central portion of the head plate 14, there is formed a hole 14B through which the pogo ring 16 passes.

The card exchanging mechanism 20 comprises a card supporting member 21 for supporting thereon the probe card 13, a retractable mechanism 22 serving as a horizontally moving mechanism, and two pair of air cylinders (main lift mechanisms) 24 and cam mechanisms (auxiliary lift mechanisms) 35. The air cylinders 24 and cam mechanisms 35 constitute a vertically moving mechanism. The retractable mechanism 22 is designed to move the card supporting mechanism 21 between a connecting position of the probe card 13 corresponding to the pogo ring 16 and the a region near the opening (the door 10D) of the case 10C in substantially horizontal direction (Y direction). The air cylinder 24 and the cam mechanism 35 are designed to move the card supporting mechanism 21 in directions Z perpendicular to the head plate 14 so as to connect and disconnect the probe card 13 to and from the test head 15 via the pogo ring 16.

The card supporting member 21 has a rectangular supporting plate having a hole 23A facing the probe card 13 at the center thereof. On the right and left sides of the supporting plate 23, there are arranged bearing blocks 25 for bearing two air cylinders 24, respectively. Each bearing block 25 is connected to the retractable mechanism 22. To the supporting plate 23, a pair of right and left connecting plates 26 is connected. Each connecting plate 26 has a reversed. L-shaped section (FIG. 1). To the top of each connecting plate 26, a rod 24A of a corresponding one of the air cylinders 24 is connected. On the supporting plate 23, a plurality of positioning pins (not shown) for orienting the probe card 13 are provided.

Figure 5:
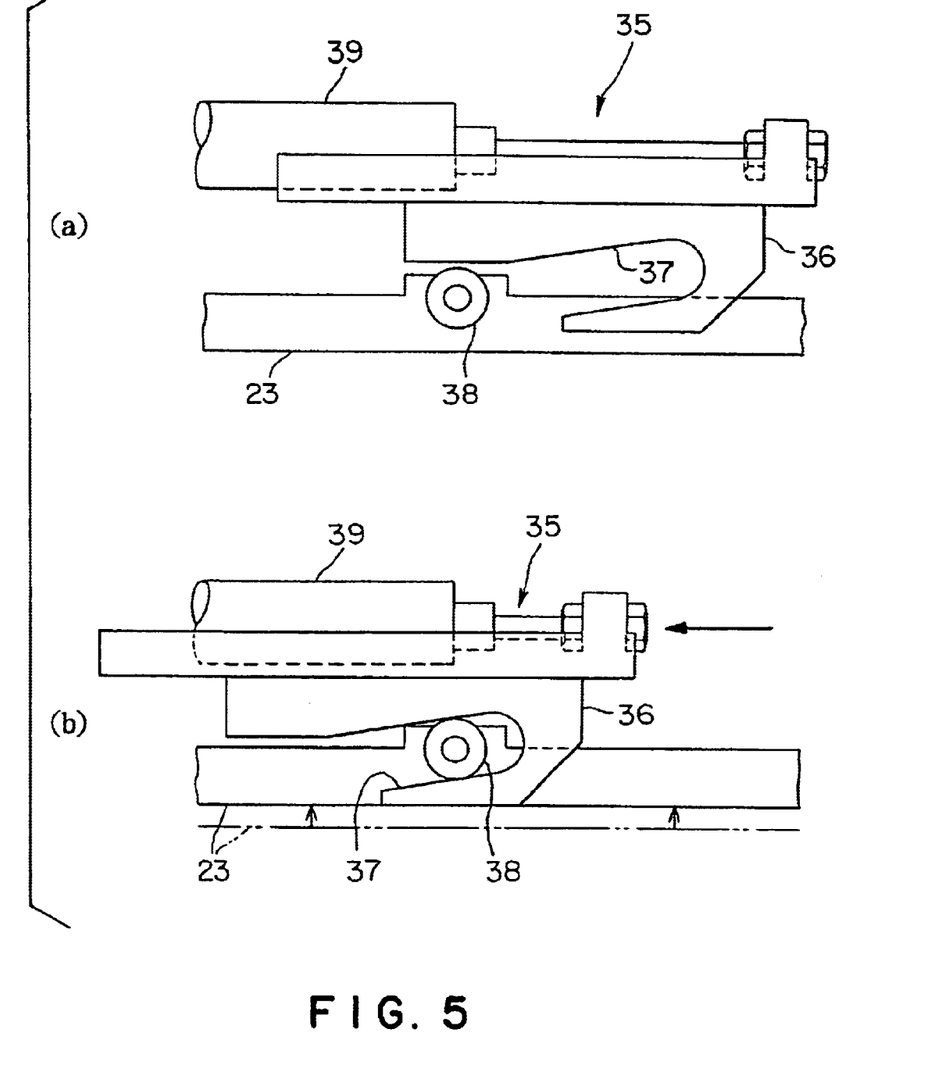
FIG. 5 is an enlarged view showing one of auxiliary lift mechanism in the probe system of FIG. 1.

As shown in FIG. 5, the cam mechanism 35 serving as the auxiliary lift mechanism comprises a cam block 36 having an inclined U-shaped cam groove 37, and a roller type cam follower 38 rotatably mounted on the supporting plate 23. The cam block 36 is designed to be horizontally driven by an actuating cylinder 39. FIG. 5(a) shows a state that the supporting plate 23 is upwardly moved to a temporary connecting position (which will be described later) by means of the air cylinder 24 serving as the main lift mechanism, and FIG. 5(b) shows another state that the supporting plate 23 is upwardly moved to a complete connecting position (which will be described later) by means of the cam mechanism 35 serving as the auxiliary lift mechanism. That is, the cam mechanism 35 is formed as a translation cam mechanism which upwardly moves the supporting plate 23 via the follower 38 engaging the cam groove 37 by horizontally moving the cam block 36 by means of the actuating cylinder 39. Four cam blocks 36 and four followers 38 are provided so as to correspond to four corners of the supporting plate 23.

Referring to FIGS. 1 and 4 again, on each of right and left sides of the top face of the supporting plate 23, a pair of front and rear guide pins 27 is provided to vertically extend, respectively. Each of the bearing blocks 25 is formed with a through hole 25A with a bush 25B, into which a corresponding one of the guide pins 27 is fitted. By the guide pins 27 and the through holes 25A, the supporting plate 23 is guided in vertical directions.

A positioning mechanism 26A and a backlash preventing mechanism 26B for X direction are provided so as to correspond to the top of the left connecting plate 26. A backlash preventing mechanism 26B for Y direction are provided so as to correspond to the top of the right connecting plate 26. The positioning mechanism 26A comprises a positioning hole 26C, which is formed on the top of the left connecting plate 26, and a positioning pin 26D which is fixed to the head plate 14 so as to correspond to the positioning hole 26C. The positioning mechanism 26A is designed to position the supporting member 21 in horizontal directions with respect to the head plate 14. Two backlash preventing mechanisms 26B are designed to preventing backlash (looseness) of the supporting member 21, which is positioned by the positioning mechanism 26A, in X and Y directions with respect to the head plate 14, respectively.

As shown in FIGS. 1(b) and 2 through 4, the backlash preventing mechanism 26B for X direction comprises a V block 26E having a V-groove extending in Y direction, and a pin 26G (FIG. 1(b)) fixed to the head plate 14 so as to correspond to the V block 26E. As shown in FIGS. 1(a) and 2 through 4, the backlash preventing mechanism 26B for Y direction comprises a V block 26F having a V-groove extending in X directions, and a pin 26G which is the same as that shown in FIG. 1(b). As shown in FIGS. 2 through 4, the two V blocks 26E and 26F are fixed to the top of each connecting plate 26 so as to be substantially arranged at one diagonal of the supporting member 21.

As shown in FIGS. 1 through 4, the retractable mechanism 22 has a pair of right and left first retractable mechanism 28, a pair of right and left first spacers 29, a pair of right and left second retractable mechanisms 30, a pair of right and left second spacers 31, and a pair of right and left air cylinders 32 (FIGS. 2 through 4) serving as driving mechanisms. The pair of right and left first retractable mechanisms 28 is retractable while supporting the card supporting member 21 on both sides via the bearing blocks 25. Each of the second retractable mechanisms 30 is retractable while supporting a corresponding one of the first retractable mechanisms 28 with respect to the head plate 14 via the spacers 29 and 31. Each of the second retractable mechanisms 30 is connected to the first retractable mechanism 28 via the fist spacer 29 and fixed to the recessed portion 14A of the head plate 14 via the second spacer 31. Each of the air cylinders 32 is designed to cause a corresponding one of the second retractable mechanisms 30 to be extended and retracted by means of the rod 32A (FIGS. 2 and 3) connected to the first spacer 29. The first retractable mechanism 28 is designed to extend and retract by manually moving the card supporting member 21.

Each of the first and second retractable mechanisms 28 and 30 is retractable by a slide rail structure as shown in FIG. 1. Specifically, each of the first retractable mechanism 28 comprises a pair of guide rails 28A and rotating members 28B, such as rollers, which rolls between the pair of guide rails 28A and 28A. If one fixed guide rail 28A slides with respect to the other guide rail 28A via the rotating members 28B, the retractable mechanism 28 is extended and retracted.

In FIGS. 2 through 4, each of the bearing blocks 25 is provided with an air cylinder 33. The inner face of each of the first spacers 29 has a hole into which a rod 33A of the air cylinder 33 is fitted. This construction forms a stopper mechanism for restricting the extension and retraction of the first retractable mechanism 28. That is, if the card supporting member 21 is manually pushed so as to retract each first retractable mechanism 28, the rod 33A of the air cylinder 33 is fitted into the hole of the first spacer 29 to restrict the extension and retraction of each first retractable mechanism 28. Thus, the supporting member 21 can be manually pushed into the prober chamber 11 only by a distance not exceeding a predetermined distance. Reference number 34 denotes a handle used for manually moving the card transfer mechanism 21, and arrows directed toward the air cylinders 32 denote air flows of compressed air for actuating the air cylinders 32.

The procedure for exchanging the probe card in the embodiment of the probe system with the above described construction will be described below.

First, the supporting plate 23 is downwardly moved by actuating the air cylinder 24 serving as a vertically moving mechanism, to disconnect the probe card 13 from the pogo ring 16 to detach the probe card 13. Then, as shown in FIG. 4 to FIG. 3, the air cylinder 32 is actuated to advance the card supporting member 21 while extending the second retractable mechanisms 30. Then, as shown in FIG. 3, after the supporting member 21 reached a position where an operator's hand can reach the handle 34 of the supporting member 21, the air cylinder 33 forming the stopper mechanism is operated to release the restriction of the first retractable mechanism 28. At this time, the locking of the door 10D is released, and the door 10D is open by the operator's hand.

Then, the operator grips the handle 34 to pull the card supporting member 21 ahead. Thus, as shown in FIG. 2, the supporting member 21 can be drawn out thorough the opening of the case 10C having the door 10D while extending the first retractable mechanisms 28. In this state, the probe card 13 is detached from the supporting plate 23 of the card supporting member 21. Then, the next probe card 13 to be used is mounted on the supporting plate 23 so as to correspond to the positioning pin.

Then, the operator grips the handle 34 to push the card supporting member 21 toward the interior of the prober chamber 11, while the first retractable mechanisms 28 are retracted and the supporting member 21 is pushed into the prober chamber 11. After the supporting member 21 is pushed to the position of FIG. 3, the door 10D is closed and locked.

Thereafter, the air cylinder 33 is operated to fit its rod 33A into the hole of the first spacer 29 to restrict the movement of the first retractable mechanism 28. Thereafter, as shown in FIG. 3 to FIG. 4, the air cylinder 32 is actuated so that the card supporting member 21 reaches just below the pogo ring 16 while the second retractable mechanisms 31 are retracted. Then, the air cylinders 24 serving as the main lift mechanism are actuated to upwardly move the supporting plate 23 to temporarily connect the probe card 13 to the test head 15 via the pogo ring 16. At this time, the plate 23 is guided by the guide pins 27 and the through holes 25A (FIG. 1) of the bearing blocks 25 to upwardly move while being maintained horizontally.

Then, by the operation of the cam mechanisms 35 serving as the auxiliary lift mechanisms, the temporarily connected probe card 13 is further upwardly moved to be completely connected to the test head 15 via the pogo ring 16. Thus, stable connection of the supporting plate 23 is ensured.

At this time, the positioning mechanism 26A (FIG. 1) positions the probe card 13 in horizontal directions with respect to the test head 15 (pogo ring 16). In addition, the backlash preventing mechanisms 26A (FIG. 1) prevent backlash between the test head 15 (pogo ring 16) and the probe card 13. That is, in the positioning mechanism 26A, the positioning pin 26D is fitted into the positioning hole 26C to position the probe card 13. In the backlash preventing mechanisms 26B, the pins 26G and 26H contact the V-grooves of the V blocks 26E and 26F, respectively, to restrict any movement in X and Y directions. In such a state, the probe card 13 uniformly pressingly contacts the pogo ring 16 to be electrically connected to the test head 15 via the pogo ring 16.

When the wafer W is tested, the wafer W received into the prober chamber 11 from the loader system 50 is mounted on the main chuck 12. Then, the wafer W on the main chuck 12 is aligned with the probe needles 13A of the probe card 13 by means of an alignment mechanism (not shown). Thereafter, electric characteristics of the wafer W are tested by means of the probe needles 13A while the main chuck 12 is indexed.

As described above, the probe system 10 in this embodiment comprises the card supporting member 21 for supporting the probe card 13, and the card exchanging mechanism 20 having the vertically moving mechanisms 24, 35 and horizontally moving mechanism 22 for moving the card supporting member 21 in vertical and substantially horizontal directions. Therefore, the probe card 13 can be connected to the test head 15 (pogo ring 16) without moving the main chuck (supporting table) 12, so that there is not the possibility that the main chuck 12 may be damaged. Since the elements 21, 22, 24 and so forth for exchanging the probe card 13 are provided in the recessed portion 14A of the head plate 14, it is possible to save the space for arranging the elements for exchanging the probe card 13 in the probe system 10, so that it is possible to make the probe system 10 compact.

The probe system 10 in this embodiment is designed to finally connect and fix the probe card 13 to the test head 15 via the pogo ring 16 by means of the cam mechanisms 35 serving as the auxiliary lift mechanism. Therefore, since the cam mechanisms 35 and the pogo ring 16 function as a clamp mechanism for the probe card 13, it is not required to provide any independent card clamp mechanisms, so that it is possible to reducing costs for the probe system 10. In addition, the wafer W can be tested while the elements 21, 22, 24, 35 and so forth for exchanging the probe card 13 are kept in the case 11C of the system 10. Therefore, it is not required to return the card exchange system outside of the system unlike conventional systems, so that it is possible to shorten the time required to exchange the probe card 13.

By the positioning mechanism 26A for positioning the card supporting member 21 in horizontal directions with respect to the head plate 14, and by the backlash preventing mechanisms 26B for preventing backlash of the supporting member 21 positioned by the positioning mechanism 26A, the probe card 13 can be surely fixed to the test head 15 (pogo ring 16) at an appropriate connecting position without any backlash.

According to this embodiment, since the retractable mechanism 22 can utilize standard parts, such as slide rails forming the retractable mechanisms 28, 30 and air cylinders 32, it is possible to realize a decrease in costs. Since there are provided the air cylinders 33 forming the stopper mechanisms for restricting the movement of the first retractable mechanisms 28, it is possible to surely prevent the malfunction of the first retractable mechanisms 28.

Figure 5A:
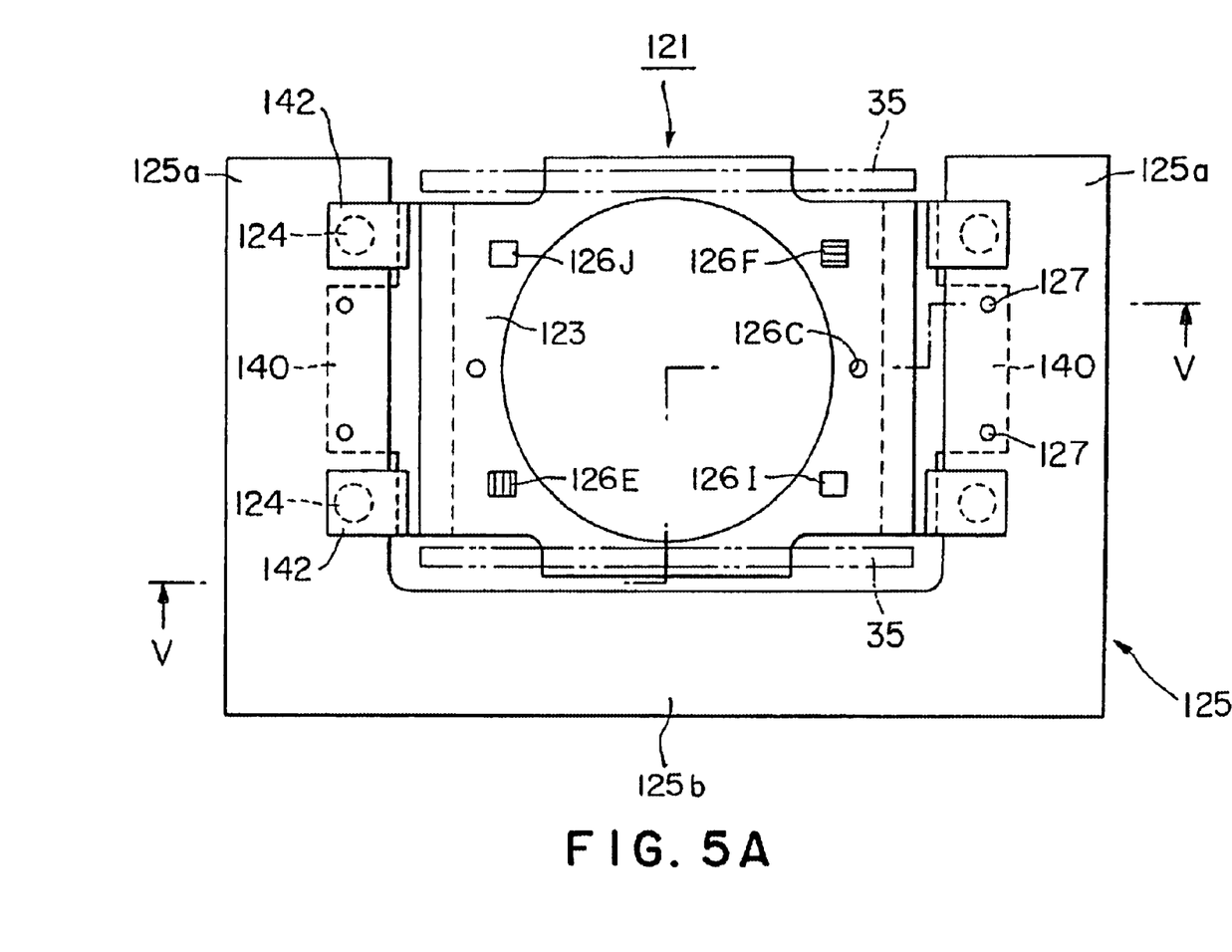
FIG. 5A is a plan view showing a modified example of a card supporting member shown in FIGS. 1 through 4.
Figure 5B:
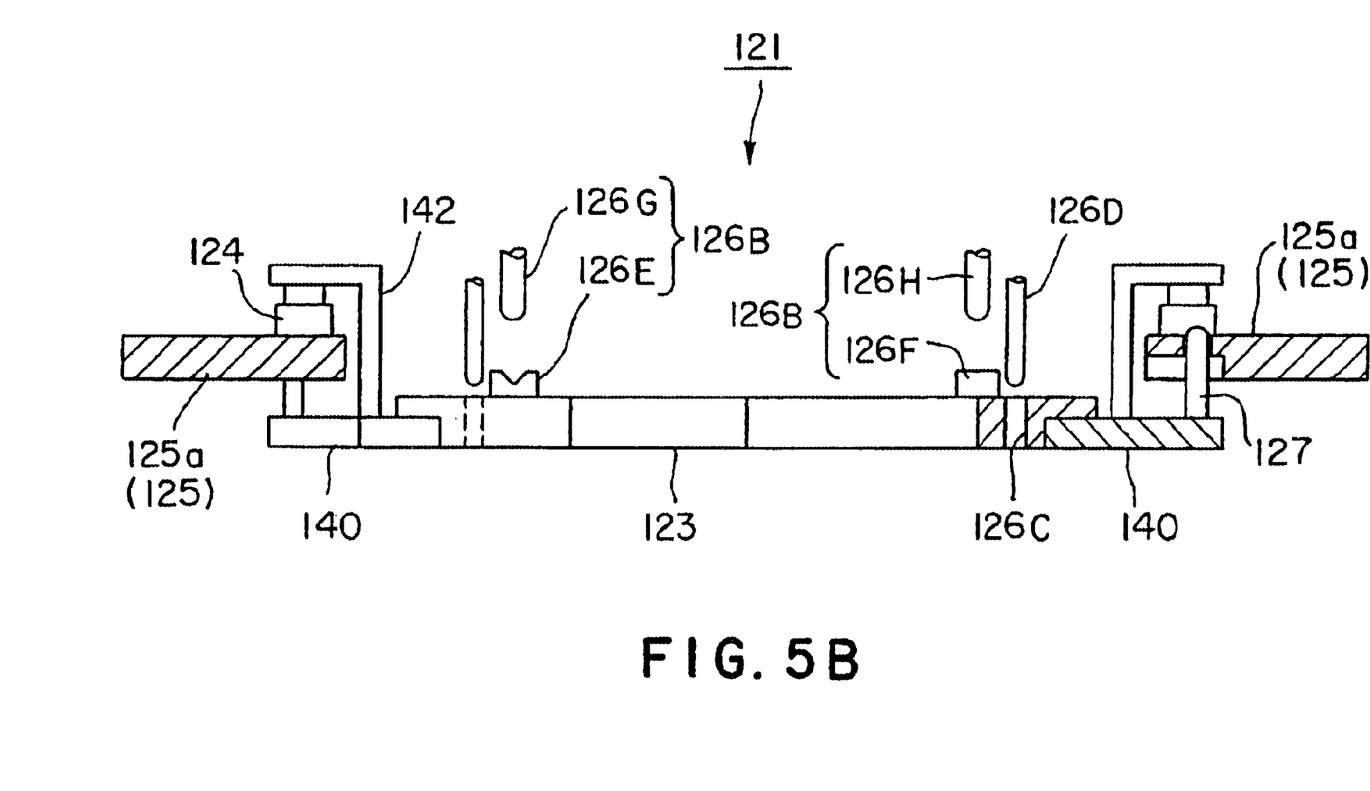
FIG. 5B is a sectional view taken along line V—V of FIG. 5A.

Referring to FIGS. 5A and 5B, a modified example of a card supporting member shown in FIGS. 1 through 4 will be described below.

The card supporting member 121 shown in FIGS. 5A and 5B is substantially the same as the card supporting member 21 shown in FIGS. 1 through 4, except that a pair of receiving plates 140 are provided between a supporting plate 123 and a bearing block 125. In this card supporting member 121, V blocks 126E and 126F forming backlash preventing mechanisms 126B for X and Y directions, and positioning holes 126C for receiving a pair of positioning pins 126D (FIG. 5B) are provided in the supporting plate 123. On the other hand, each receiving plate 140, not the supporting plate 123, is provided with two pairs of guide pins 127 passing through the bearing blocks 125.

Pins 126G and 126H forming backlash preventing mechanisms 126 together with the respective V blocks 126E and 126F, and the positioning pins 126D (FIG. 5B) are fixed to the head plate 14 shown in FIG. 1, respectively. As shown in FIG. 5A, blocks 126I and 126J forming additional backlash preventing mechanisms may be provided on the supporting plate 123.

The bearing block 125 has a pair of bearing portions 125a, and a connecting portion 125b for connecting the bearing portions 125a to each other on the side near the door 10D (FIG. 4). Each of the bearing portions 125a is provided with a pair of air cylinders 124 serving as a main lift mechanism. The rod of each of the air cylinders 124 is connected to the receiving plate 140 via a bracket 142 corresponding to the connecting plate 26 shown in FIG. 1. The supporting plate 123 is connected to the pair of receiving plates 140 by pins so as to be movable in vertical directions. On each of the front and rear sides of the supporting plate 123, the above described cam mechanism 35 (FIG. 5) serving as the auxiliary lift mechanism is arranged.

The present invention should not be limited to the above described embodiment, and can be suitably modified within the scope of the present invention. For example, while the retractable mechanism 22 has been manually operated in the first stage when being operated in two stages in the above described embodiment, it may be driven by air cylinders or the like in both of the two stages. While the slide rails have been used as the retractable mechanisms, other mechanisms may be used if they are retractable. As the translation cam mechanism 35 forming the auxiliary lift mechanism, a curved cam groove may be substituted for the linear cam groove 37 shown in FIG. 5. Moreover, a rotary cam mechanism using a disk cam or the like may be substituted for the translation cam mechanism.

What is claimed is:

1. A probe system comprising:

a case defining a prober chamber for receiving an object to be tested, said case having an opening capable of being open and closed on one side thereof;

a head plate forming a ceiling portion of said case;

a test head provided on said head plate;

a probe card detachably connected to said test head;

a card supporting member supporting said probe card;

a vertically moving mechanism for moving said card supporting member in vertical directions with respect to said head plate such that said probe card is connected/disconnected to/from said test head; and a horizontally moving mechanism for moving said card supporting member in substantially horizontal directions between a connecting position at which said probe card is connected and a region near said opening of said case.

2. A probe system as set forth in claim 1, further comprising:

a positioning mechanism for positioning said card supporting member in horizontal directions with respect to said head plate; and a backlash preventing mechanism for preventing backlash of said card supporting member positioned by the positioning mechanism with respect to said head plate.

3. A probe system as set forth in claim 1, wherein said horizontally moving mechanism comprises:

a pair of first retractable mechanisms retractable while supporting said card supporting member from both sides;

a pair of second retractable mechanisms retractable while supporting said first retractable mechanisms with respect to said head plate, respectively; and a pair of driving mechanisms for driving said second retractable mechanisms to extend and retract said second retractable mechanisms.

4. A probe system as set forth in claim 3, further comprising a stopper mechanism for restricting extension and retraction of said first retractable mechanisms.

5. A probe system as set forth in claim 1, wherein said vertically moving mechanism comprises:

a main lift mechanism for downwardly moving said card supporting member with respect to said head plate so as to remove said probe card from said test head, and for upwardly moving said card supporting member with respect to said head plate so as to temporarily connect said probe cared to said test head; and an auxiliary lift mechanism for further upwardly moving said card supporting member with respect to said head plate so as to completely connect the temporarily connected probe card to said test head.

6. A probe system as set forth in claim 5, wherein said auxiliary lift mechanism is a cam mechanism.

* * * * *